United States Patent [19]
Bernardson et al.

[11] Patent Number: 5,610,505
[45] Date of Patent: Mar. 11, 1997

[54] VOLTAGE-TO-CURRENT CONVERTER WITH MOS REFERENCE RESISTOR

[75] Inventors: Peter S. Bernardson, Emmaus; Dale H. Nelson, Shillington, both of Pa.

[73] Assignee: Lucent Technologies, Inc., Murray Hill, N.J.

[21] Appl. No.: 522,188

[22] Filed: Aug. 31, 1995

[51] Int. Cl.⁶ .................................................. G05F 3/04
[52] U.S. Cl. ........................... 323/312; 323/315; 363/73
[58] Field of Search ................................. 323/280, 312, 323/315; 363/73; 330/277

[56] References Cited

U.S. PATENT DOCUMENTS

| | | | |
|---|---|---|---|
| 4,427,903 | 6/1981 | Sugimoto | 307/355 |
| 4,550,262 | 10/1985 | Kohsiek | 323/315 |
| 4,618,814 | 10/1986 | Kato et al. | 363/73 |
| 4,835,487 | 4/1988 | Doyle et al. | 330/277 |
| 5,216,354 | 3/1992 | DeGuelle | 323/312 |
| 5,266,887 | 4/1992 | Smith | 323/316 |
| 5,317,279 | 12/1992 | Zarabadi et al. | 330/532 |
| 5,451,859 | 9/1995 | Ryat | 323/312 |
| 5,525,927 | 6/1996 | Yung et al. | 323/315 |

OTHER PUBLICATIONS

Tsividis et al., "Continuous–Time MOSFET–C Filters in VLSI", *IEEE Transactions on Circuits and Systems,* vol. CAS–33, No. 2, Feb. 1986, pp. 125–140.

Bilotti, "Operation of a MOS Transistor as a Variable Resistor", *Proceedings of the IEEE,* vol. 54, Aug. 1966, pp. 1093–1094.

*Primary Examiner*—Stuart N. Hecker
*Attorney, Agent, or Firm*—David L. Smith

[57] ABSTRACT

A voltage-to-current converter comprises a first MOS transistor for receiving a voltage signal at a first gate and transferring a current signal between a first drain and a first source, a second MOS transistor for receiving a biasing voltage at a second gate and transferring the current signal between a second drain and a second source, and a biasing circuit for applying the biasing voltage of $V_C+V_T+kV_{DS}$ to the second gate such that the second transistor provides a substantially constant drain-to-source resistance of $1/\beta V_C$, where $V_C$ is a constant voltage, $V_T$ is a threshold voltage for the second transistor, $V_{DS}$ is a drain-to-source voltage for the second transistor, k is a constant in the range of ⅓ to ⅔, and $\beta$ is a gain for the second transistor.

30 Claims, 5 Drawing Sheets

VOLTAGE-TO-CURRENT CONVERTER WITH MOS REFERENCE RESISTOR

FIELD OF THE INVENTION

The invention relates generally to voltage-controlled current sources, and more particularly to voltage-to-current converters utilizing MOS devices.

BACKGROUND OF THE INVENTION

In electronic circuits, voltage sources and current sources are well known electronic building blocks. Voltage-controlled current sources include voltage-to-current converters. Voltage-to-current converters transform an input voltage signal into an output current signal. The current signal is relatively independent of a load impedance. Linearized voltage-to-current converters generate a current signal that is substantially linearly proportional to a voltage signal. Linearized voltage-to-current converters are used, for instance, in convolvers, correlators, adaptive filters, multipliers, dividers, squaring circuits, integrators, analog-to-digital converters, phase-locked loops, and other applications in which a current signal, rather than a voltage signal, is required as in input signal to another circuit.

Many schemes exist for implementing linearized voltage-to-current converters. For example, in an integrated circuit, a voltage-to-current converter can be provided using a metal-oxide semiconductor (MOS) transistor coupled to a reference resistor. For instance, an N-channel MOS (NMOS) transistor with a source coupled to a reference resistor can convert a gate voltage into a linearly related drain current. The NMOS transistor and reference resistor can be fabricated with 0.9 micrometer technology using a P-type semiconductor substrate, with the diffused N-type semiconductor region (or tub) for the source being sufficiently doped as to also provide an N-type reference resistor. Although this approach is compact, it has certain drawbacks. First, the resistance of the N-type reference resistor may be difficult to control due to processing variations in doping levels. Furthermore, the resistance of the N-type reference resistor may drift during operation in response to voltage or temperature changes. Consequently, the value of an N-type reference resistor may vary by as much as 20 percent. Similar drawbacks attend to P-type reference resistors.

Reference resistors with well-controlled resistances are available. For instance, an external resistor may be interconnected to the integrated circuit, but the interconnection may require an additional bonding pad on the surface of the integrated circuit. Or, reference resistors integral to the integrated circuit can be rendered more accurate using laser trimming or link blowing, but these techniques require additional processing and testing steps.

Operational amplifiers may also be used as voltage-to-current converters by inputting a voltage signal to the noninverting input and having the output drive a Darlington transistor pair which supplies the desired output current. A drawback of operational amplifiers is the need for relatively complex circuitry and a significant amount of silicon area for its implementation.

Based on the foregoing, there is a need for an accurate, linearized, and cost-effective voltage-to-current converter for implementation in an integrated circuit.

SUMMARY OF THE INVENTION

A primary aspect of the invention is linearized voltage-to-current converter employing a transistor with substantially constant resistance as a reference resistor. Preferably, a MOS transistor operated in a triode region has a substantially constant drain-to-source resistance.

In accordance with one aspect of the invention, a voltage-to-current converter comprises a first transistor for receiving a voltage signal and transferring a current signal, a second MOS transistor for receiving a biasing voltage at a second gate and transferring at least a portion of the current signal between a second drain and a second source, and a biasing circuit for applying the biasing voltage to the second gate. The biasing voltage is a function of at least a voltage $V_{DS}$ between the second drain and the second source and a threshold voltage $V_T$ for the second transistor such that the second transistor provides a substantially constant drain-to-source resistance.

In one embodiment, the biasing voltage is substantially equal to $V_C+V_T+kV_{DS}$ so that the second transistor, while operating in the triode region, has a substantially constant drain-to-source resistance of substantially $1/\beta V_C$, where $V_C$ is a constant voltage, k is a constant in the range of approximately ⅓ to ⅔ and β is a gain for the second transistor. The drain-to-source resistance is relatively immune to variations in the voltage signal. Therefore, the second transistor provides a good reference resistor for linearized voltage-to-current conversion.

BRIEF DESCRIPTION OF THE DRAWING

The invention, together with its various features and advantages, can be readily understood from the following detailed description taken in conjunction with the accompanying drawing, in which.

DETAILED DESCRIPTION

Figure 1:
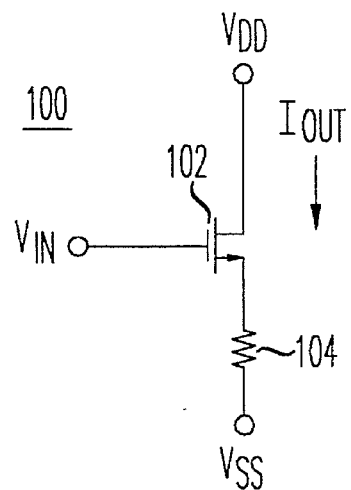
FIG. 1 is a circuit diagram illustrating a MOS transistor and a reference resistor configured as a conventional voltage-to-current converter.
Figure 2:
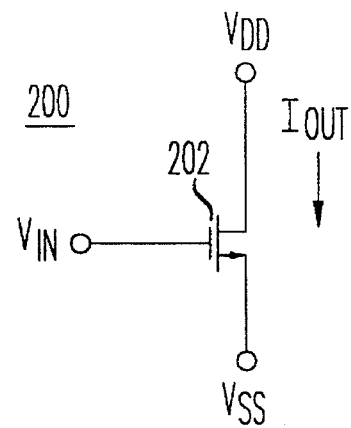
FIG. 2 is a circuit diagram illustrating a long-channel MOS transistor configured as a conventional voltage-to-current converter.
Figure 3:
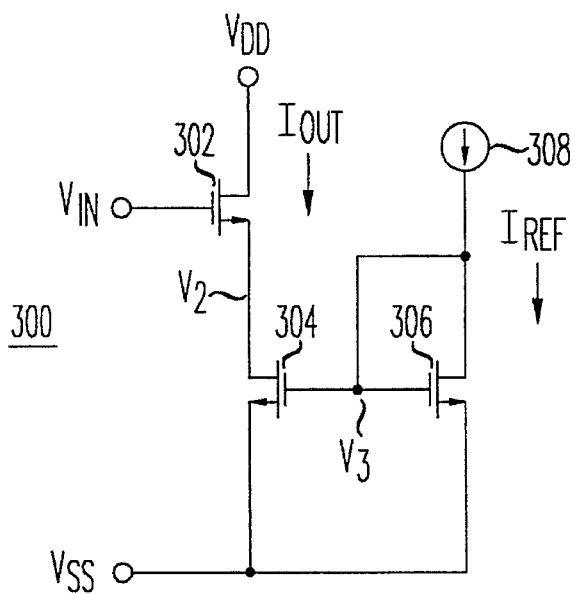
FIG. 3 is a circuit diagram illustrating several MOS transistors configured as a conventional voltage-to-current converter.

FIGS. 1–3 illustrate several conventional voltage-to-current converters in order to provide a more complete understanding of the present invention.

FIG. 1 is a circuit diagram illustrating a MOS transistor and a reference resistor configured as a conventional voltage-to-current converter. Circuit 100 converts voltage signal $V_{in}$ into current signal $I_{out}$. Circuit 100 includes NMOS transistor 102 coupled at its source to reference resistor 104. Transistor 102 is preferably a short-channel device, that is, with a channel length near or below 1 micrometer, so that the drain current in saturation increases linearly with gate bias. Reference resistor 104 decreases the noise and jitter sensitivity of circuit 100 during operation. The source of transistor 102 and reference resistor 104 may be fabricated, for instance, in a single N-type region of a P-type substrate. Voltage signal $V_{in}$ is applied to the gate of transistor 102, and current signal $I_{out}$ is equivalent to the drain-to-source current $I_{DS}$ for transistor 102. Transistor 102 has a threshold voltage $V_T$, and reference resistor 104 has a resistance R. Power supply voltages $V_{DD}$ and $V_{ss}$ are applied to circuit 100 and to the other circuits described herein, with $V_{ss}$ at ground for convenience of explanation. It is assumed that the drain-to-source resistance $R_{DS}$ of transistor 102 becomes negligible in comparison to resistance R as $V_{in}$ substantially exceeds $V_T$. Therefore, the current voltage relationship for circuit 100 is substantially in accordance with the following simplified first-order linear equations:

$$I_{out} = 0 \qquad V_{in} \leq V_T \qquad (1)$$

$$I_{out} = \frac{V_{in} - V_T}{R} \qquad V_{in} > V_T \qquad (2)$$

Thus, when voltage signal $V_{in}$ exceeds threshold voltage $V_T$, then current signal $I_{out}$ is linearly related to voltage signal $V_{in}$. Since, however, reference resistor 104 is an N-type resistor, the value of resistance R may be difficult to control, as mentioned above.

FIG. 2 is a circuit diagram illustrating a long-channel MOS transistor configured as a conventional voltage to-current converter. Circuit 200 converts voltage signal $V_{in}$ into current signal $I_{out}$. Circuit 200 includes long-channel NMOS transistor 202. The channel length of transistor 202 is near or above 1 micrometer, and preferably on the order of 25 micrometers, so that the drain current in saturation increases quadratically with gate bias. Furthermore, the drain-to-source resistance $R_{DS}$ of transistor 202 is sufficiently high as to provide a reference resistor. Voltage signal $V_{in}$ is equivalent to the gate-to-source voltage $V_{GS}$ of transistor 202, and current signal $I_{out}$ is equivalent to the drain-to-source current $I_{DS}$ for transistor 202. Transistor 202 has a gain $\beta$ (i.e. current amplification factor) and a threshold voltage $V_T$. Both the gain $\beta$ and the threshold voltage $V_T$, remain substantially constant despite variations in $V_{GS}$ and $I_{DS}$. Therefore, the current-voltage relationship for circuit 200 is substantially in accordance with the following simplified equations:

$$I_{out} = 0 \qquad\qquad V_{in} \leq V_T \qquad (3)$$
$$I_{out} = \beta[(V_{in} - V_T)V_{DS} - kV_{DS}^2] \quad V_{in} > V_T \text{ and } V_{DS} \leq V_{sat} \qquad (4)$$
$$I_{out} = k\beta (V_{in} - V_T)^2 \qquad V_{in} > V_T \text{ and } V_{DS} > V_{sat} \qquad (5)$$

where $$\beta = \frac{W \epsilon_{ox} \mu_n}{L t_{ox}}$$

W=channel width
L=channel length
$\epsilon_{ox}$=oxide dielectric constant
$\mu_n$=electron mobility constant
$t_{ox}$=oxide thickness $V_{sat}$=saturation voltage
and k is a constant Equation (4) corresponds to the triode region (i.e. resistive region or non-saturated region in I-V curve) of transistor 202, whereas equation (5) corresponds to the saturation region (i.e. flat region in I-V curve) of transistor 202. The constant k is often reported in the literature as ½ although this value is based on several simplifications as well as assumptions which may vary in practice. In equation (5), ½ is considered a reasonable approximation for k. However, in equation (4), a range of approximately ⅓ to ⅔ is considered a reasonable approximation for k (although k approaches ½ as $V_{DS}$ approaches $V_{sat}$). The negative sign associated with $\mu_n$ is omitted for convenience of explanation. In accordance with equations (4) and (5), when voltage signal $V_{in}$ exceeds threshold voltage $V_T$, then current signal $I_{out}$ is quadratically related to voltage signal $V_{in}$. Therefore, circuit 200 does not provide linearized voltage-to-current conversion.

FIG. 3 is a circuit diagram illustrating another conventional voltage-to-current converter. Circuit 300 converts voltage signal $V_{in}$ into current signal $I_{out}$. Circuit 300 includes NMOS transistor 302 (similar to transistor 102) coupled to long-channel NMOS transistor 304 (similar to transistor 202). NMOS Transistor 306 is also a long-channel transistor. Current source 308 provides current signal $I_{ref}$ to the drain of transistor 306. Voltage signal $V_{in}$ is applied to the gate of transistor 302, and current signal $I_{out}$ is equivalent to the drain-to-source current $I_{DS}$ for transistors 302 and 304. Transistor 304 has a gain $\beta_1$, and a threshold voltage $V_{T1}$. Likewise, transistor 306 has a gain $\beta_2$, and a threshold voltage $V_{T2}$. For convenience, the drain-to-source voltage $V_{DS}$ for transistor 304 is defined as voltage $V_2$, and the gate-to-source voltage $V_{GS}$ for transistors 304 and 306 is defined as voltage $V_3$. In accordance with equation (4), operating transistor 304 in the triode region yields the following:

$$I_{out} = \beta_1[(V_3 - V_{T1})V_2 - kV_2^2] \qquad (6)$$

Equation (6) can be divided by $V_2$ and then inverted to derive the drain-to-source resistance $R_{DS}$ for transistor 304:

$$\frac{V_2}{I_{out}} = \frac{1}{\beta_1(V_3 - V_{T1} - kV_2)} = R_{DS} \qquad (7)$$

Likewise, in accordance with equation (5), operating transistor 306 in the saturation region yields the following:

$$I_{ref} = k\beta_2(V_3 - V_{T2})^2 \qquad (8)$$

Solving equation (8) for $V_3$ yields the following:

$$V_3 = V_{T2} + (I_{ref}/k\beta_2)^{1/2} \qquad (9)$$

Substituting equation (9) into equation (7), with the assumption that $V_{T1} = V_{T2}$, yields the following:

$$\frac{V_2}{I_{out}} = \frac{1}{\beta_1[(I_{ref}/k\beta_2)^{1/2} - kV_2]} = R_{DS} \qquad (10)$$

Equation (10) indicates that, for a constant current signal $I_{ref}$, the drain-to-source resistance $R_{DS}$ for transistor 304 varies in response to voltage $kV_2$. Furthermore, voltage $V_2$ varies in response to voltage signal $V_{in}$. Therefore, resistance $R_{DS}$ varies in response to voltage signal $V_{in}$. As a result, transistor 304 does not provide a substantially constant reference resistor. Therefore, circuit 300 does not provide a linearized voltage-to-current converter.

Voltage-to-current converters in accordance with several embodiments of the present invention are set forth in the circuits shown in FIGS. 4–7.

Figure 4:
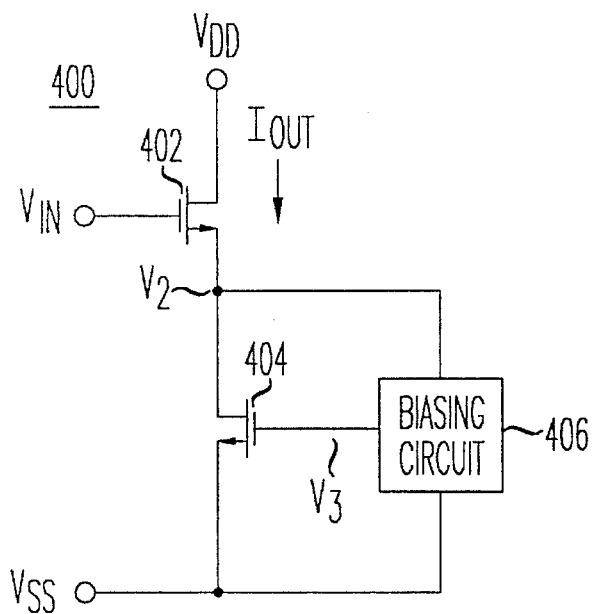
FIG. 4 is a circuit diagram illustrating a voltage-to-current converter in accordance with an embodiment of the invention.

FIG. 4 is a circuit diagram illustrating a voltage-to-current converter in accordance with an embodiment of the invention. Circuit 400 converts voltage signal $V_{in}$ into current signal $I_{out}$. Circuit 400 includes NMOS transistor 402 (similar to transistor 102) coupled to long-channel NMOS transistor 404 (similar to transistor 202). In particular, the source of transistor 402 is coupled along a signal path to the drain of transistor 404. Biasing circuit 406 is coupled to the gate of transistor 404. Voltage signal $V_{in}$ is applied to the gate of transistor 402, and current signal $I_{out}$ is equivalent to the drain-to-source current $I_{DS}$ for transistors 402 and 404. Transistor 404 has a gain $\beta$, a threshold voltage $V_T$, and a drain-to-source resistance of $R_{DS}$. For convenience, the drain-to-source voltage $V_{DS}$ for transistor 404 is defined as voltage $V_2$, and the gate-to-source voltage $V_{GS}$ for transistor 404 is defined as voltage $V_3$. In accordance with equation (7), operating transistor 404 in the triode region yields the following:

$$\frac{V_2}{I_{out}} = \frac{1}{\beta(V_3 - V_T - kV_2)} = R_{DS} \quad (11)$$

Biasing circuit 406 applies a biasing voltage to the gate of transistor 404 so that resistance $R_{DS}$ is substantially constant. From equation (11), it is apparent that resistance $R_{DS}$ is a function of voltages $V_3$, $V_T$ and $V_2$. In accordance with the invention, an appropriate biasing voltage $V_3$ can be determined by relating voltage $V_3$ to voltages $V_T$ and $V_2$. In order to keep resistance $R_{DS}$ substantially constant, biasing circuit 406 sets biasing voltage $V_3$ to approximately $V_C+V_T+kV_2$, where $V_C$ is a constant voltage. Assuming, for convenience, that $V_3=V_C+V_T+kV_2$, equation (11) yields the following:

$$\frac{V_2}{I_{out}} = \frac{1}{\beta V_C} = R_{DS} \quad (12)$$

In accordance with equation (12), the drain-to-source resistance $R_{DS}$ is $1/\beta V_C$. Since equation (12) is based on various assumptions and simplifications, the actual drain-to-source resistance $R_{DS}$ of transistor 404 may vary slightly from $1/\beta V_C$. Nevertheless, resistance $R_{DS}$ is substantially $1/\beta V_C$. Furthermore, $1/\beta V_C$ is substantially constant, and is relatively immune to variations in current signal $I_{out}$. Consequently, resistance $R_{DS}$ is substantially constant as well. Therefore, using transistor 404 as a reference resistor, current signal $I_{out}$ is substantially linearly proportional to the voltage signal $V_{in}$.

In effect, biasing circuit 406 dynamically converts the drain-to-source voltage $V_{DS}$ and threshold voltage $V_T$ of transistor 404 into an appropriate gate-to source voltage $V_{GS}$ for transistor 404. When transistor 404 is operating in the triode region, substantially in accordance with equation (11), then biasing circuit 406 linearly relates voltage $V_{GS}$ (represented by $V_3$) to voltages $V_T$ and $V_{DS}$ (represented by $V_2$) such that voltage $V_{GS}$ remains a constant voltage $V_C$ (such as half a volt) above the sum of voltages $V_T$ and $kV_{DS}$. Threshold voltage $V_T$ be difficult to control due to processing variations in doping levels, and may drift during operation in response to temperature changes. Likewise, voltage $V_{DS}$ may vary in response to variations in the drain-to-source current $I_{DS}$ (represented by $I_{out}$) of transistor 404. Biasing circuit 406 solves this problem by dynamically biasing the gate of transistor 404, as a function of at least $V_T$ and $V_{DS}$, so that the effective drain-to-source resistance $R_{DS}$ of transistor 404 remains substantially constant despite variations in $V_T$ and $V_{DS}$. Therefore, transistor 404 provides a good reference resistor for linearized voltage-to-current conversion. Furthermore, the resistance $R_{DS}$ can be accurately controlled by selecting an appropriate value for voltage $V_C$.

Figure 5:
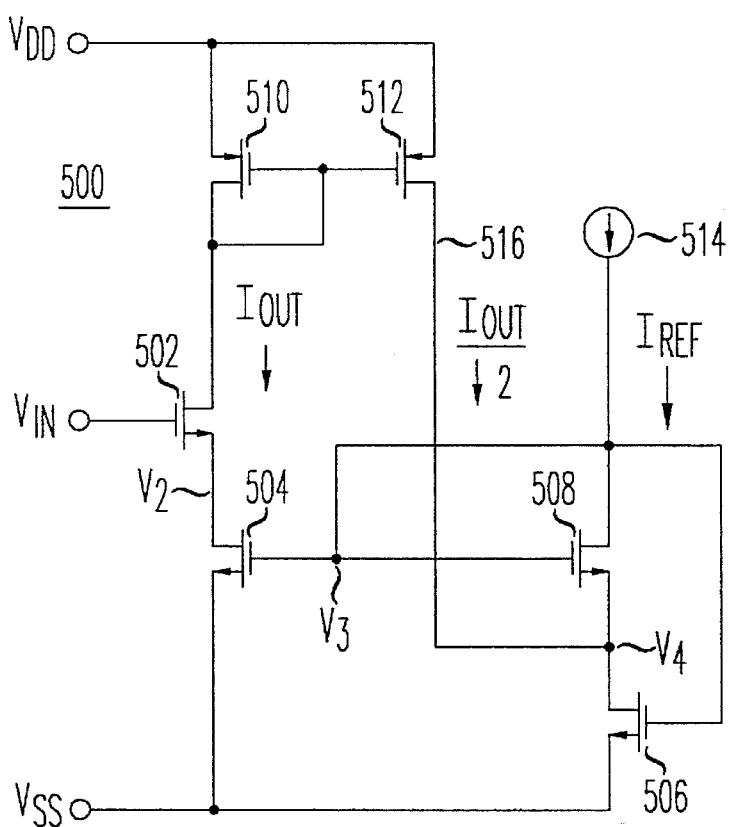
FIG. 5 is a circuit diagram illustrating a voltage-to-current converter in accordance with another embodiment of the invention.

FIG. 5 discloses a voltage-to-current converter in accordance with another embodiment of the invention. Circuit 500 converts voltage signal $V_{in}$ in into current signal $I_{out}$. Circuit 500 includes NMOS transistor 502 (similar to transistor 102) coupled to long-channel NMOS transistor 504 (similar to transistor 202). The biasing circuit of circuit 500 includes NMOS transistors 506, 508, 510 and 512, and current source 514. In this embodiment, for illustration purposes, k is approximately ½. Voltage signal $V_{in}$ is applied to the gate of transistor 502, and current signal $I_{out}$ is equivalent to the drain-to-source current $I_{DS}$ for transistors 502 and 504. For convenience, the drain-to-source voltage $V_{DS}$ for transistor 504 is defined as voltage $V_2$, the drain-to-source voltage $V_{DS}$ for transistor 506 is defined as voltage $V_4$, and the drain-to-source voltage $V_{DS}$ for transistor 508 is defined as voltage $V_3-V_4$. Likewise, the gate-to-source voltage $V_{GS}$ for transistors 504 and 506 is defined as voltage $V_3$, and the gate-to-source voltage $V_{GS}$ for transistor 508 is defined as voltage $V_3-V_4$. Transistor 504 has a gain $\beta_1$, a threshold voltage $V_{T1}$, and a drain-to-source resistance of $R_{DS1}$. Likewise, transistor 506 has a gain $\beta_2$, a threshold voltage $V_{T2}$, and a drain-to-source resistance of $R_{DS2}$, and transistor 508 has a gain $\beta_3$, a threshold voltage $V_{T3}$, and a drain-to-source resistance of $R_{DS3}$. Preferably, transistors 504 and 506 have identical current-voltage characteristics, and transistors 504, 506 and 508 have identical threshold voltages. In accordance with equation (7), operating transistor 504 in the triode region, with k of approximately ½ yields the following:

$$\frac{V_2}{I_{out}} = \frac{1}{\beta_1(V_3 - V_{T1} - 1/2V_2)} = R_{DS1} \quad (13)$$

Transistors 510 and 512 are configured in a current mirror arrangement so that transistor 512 generates scaled current signal ½$I_{out}$ along signal path 516. For instance, the channel width-to-length (W/L) ratios of transistors 510 and 512 may be appropriately scaled, as is conventional. Furthermore, the channel W/L ratios of transistors 510 and 512 can be scaled to generate a scaled current signal $kI_{out}$ to conform with other values of k. The drain-to-source current $I_{DS}$ for transistor 506 is equivalent to the combination of scaled current signal ½$I_{out}$ and reference current $I_{ref}$. Assuming, for simplification purposes, that $I_{ref}$ is small in comparison to ½$I_{out}$, then $I_{DS}$ for transistor 506 is approximately ½$I_{out}$. In accordance with equation (7), operating transistor 506 in the triode region, with k of approximately ½, yields the following:

$$\frac{V_4}{1/2I_{out}} = \frac{1}{\beta_2(V_3 - V_{T2} - 1/2V_4)} = R_{DS2} \quad (14)$$

Transistors 504 and 506 are substantially matched, so that $\beta_1$ is approximately equal to $\beta_2$, and $V_{T1}$ is approximately equal to $V_{T2}$. Assuming, for simplification purposes, that $\beta_1=\beta_2$, $V_{T1}=V_{T2}$, and the difference between voltages $V_2$ and $V_4$ is small, then $R_{DS1}$ is similar to $R_{DS2}$. Further assuming that $R_{DS1}=R_{DS2}$, equations (13) and (14) yield the following:

$$\frac{V_4}{1/2I_{out}} = \frac{V_2}{I_{out}} \quad (15)$$

Equation (15) can be solved for $V_4$ as follows:

$$V_4=\frac{1}{2}V_2 \quad (16)$$

In accordance with equation (9), operating transistor 508 in the saturation region, with current source 514 generating reference current $I_{ref}$, voltage $V_4$ applied to the source of transistor 508, and k of approximately ½, yields the following:

$$V_3 = V_4 + V_{T3} + (2I_{ref}/\beta_3)^{1/2} \quad (17)$$

Substituting equations (16) and (17) into equation (13), and assuming $V_{T1} = V_{T3}$, yields the following:

$$\frac{V_2}{I_{out}} = \frac{1}{\beta_1(2I_{ref}/\beta_2)^{1/2}} = R_{DS1} \quad (18)$$

Equation (18) indicates that resistance $R_{DS1}$ is immune to variations in voltages $V_2$ and $V_{T1}$. Equation (18) also indicates that, for a constant $I_{ref}$, resistance $R_{DS1}$ remains substantially constant despite variations in current signal $I_{out}$. Furthermore, the value of $R_{DS1}$ can be adjusted by adjusting the value of $I_{ref}$ generated by current source 516. The preferred value of $I_{ref}$ depends on various factors such as the desired linear range of $I_{min} \leq I_{out} \leq I_{max}$, the relative magnitudes of voltages $V_2$ and $V_{T2}$, and the application in which circuit 500 is used. It is generally preferred that $I_{ref}$ be substantially less than $I_{min}$, for instance, $I_{ref} \leq \frac{1}{2} I_{min}$.

Figure 6:
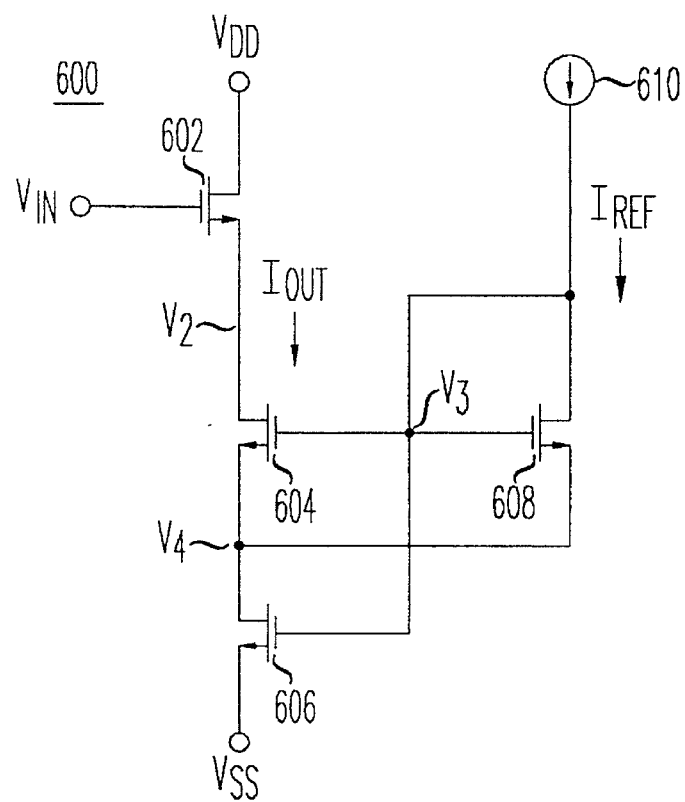
FIG. 6 is a circuit diagram illustrating a voltage-to-current converter in accordance with still another embodiment of the invention.

FIG. 6 discloses a voltage-to-current converter in accordance with another embodiment of the invention. Circuit 600 converts voltage signal $V_{in}$ into current signal $I_{out}$. Circuit 600 includes NMOS transistor 602 (similar to transistor 102) coupled to long-channel NMOS transistors 604 and 606 (each similar to transistor 202). In this embodiment, transistors 604 and 606 collectively provide the reference resistor. Preferably, transistors 604 and 606 have identical current-voltage characteristics. The biasing circuit in circuit 600 includes NMOS transistor 608 and current source 610. In this embodiment, for illustration purposes, k is approximately ½. Voltage signal $V_{in}$ is applied to the gate of transistor 602, current signal $I_{out}$ is equivalent to the drain-to-source current $I_{DS}$ for transistors 602 and 604, and the combination of current signal $I_{out}$ and reference current $I_{ref}$ is equivalent to the drain-to-source current $I_{DS}$ for transistor 606. Assuming, for simplification purposes, that $I_{ref}$ is small in comparison to $I_{out}$, then $I_{DS}$ for transistor 606 is approximately $I_{out}$. For convenience, the combined drain-to-source voltages for transistors 604 and 606 is defined as voltage $V_2$, and the drain-to-source voltage $V_{DS}$ for transistor 606 is defined as voltage $V_4$, and therefore the drain-to-source voltage $V_{DS}$ for transistor 604 is voltage $V_2 - V_4$. Likewise, the gate-to-source voltage $V_{GS}$ for transistors 604 and 608 is defined as voltage $V_3 - V_4$, and the gate-to-source voltage $V_{GS}$ for transistor 606 is defined as voltage $V_3$. Transistor 604 has a gain $\beta_1$, a threshold voltage $V_{T1}$, and a drain-to-source resistance of $R_{DS1}$. Likewise, transistor 606 has a gain $\beta_2$, a threshold voltage $V_{T2}$, and a drain-to-source resistance of $R_{DS2}$, and transistor 608 has a gain $\beta_3$, a threshold voltage $V_{T3}$, and a drain-to-source resistance of $R_{DS3}$. Preferably, transistors 604 and 606 have identical current-voltage characteristics, and transistors 604, 606 and 608 have identical threshold voltages. In accordance with equation (7), operating transistor 604 in the triode region, with k of approximately ½, yields the following:

$$\frac{V_2 - V_4}{I_{out}} = \frac{1}{\beta_1[V_3 - V_4 - V_{T1} - 1/2(V_2 - V_4)]} = R_{DS1} \quad (19)$$

Likewise, operating transistor 606 in the triode region, with k of approximately ½, yields the following:

$$\frac{V_4}{I_{out}} = \frac{1}{\beta_2(V_3 - V_{T2} - 1/2V_4)} = R_{DS2} \quad (20)$$

Transistors 604 and 606 are substantially matched, so that $\beta_1$ is approximately equal to $\beta_2$, and $V_{T1}$ is approximately equal to $V_{T2}$. Assuming, for simplification purposes, that $\beta_1 = \beta_2$, $V_{T1} = V_{T2}$, the difference between voltages $V_3 - V_4$ and voltage $V_3$ is small, and the difference between voltages $V_2 - V_4$ and voltage $V_4$ is small, then $R_{DS1}$ is similar to $R_{DS2}$.

Further assuming that $R_{DS1} = R_{DS2}$, equations (19) and (20) yield the following:

$$\frac{V_2 - V_4}{I_{out}} = \frac{V_4}{I_{out}} \quad (21)$$

Equation (21) can be solved for $V_4$ as follows:

$$V_4 = \frac{1}{2}V_2 \quad (22)$$

In accordance with equation (9), operating transistor 608 in the saturation region, with current source 610 generating reference current $I_{ref}$, voltage $V_4$ applied to the source of transistor 608, and k of approximately ½, yields the following:

$$V_3 = V_4 + V_{T3} + (2I_{ref}/\beta_3)^{1/2} \quad (23)$$

Combining equations (19) and (20) yields the following:

$$\frac{V_2 - V_4}{I_{out}} + $$

$$\frac{V_4}{I_{out}} = \frac{1}{\beta_1[V_3 - V_4 - V_{T1} - 1/2(V_2 - V_4)]} + $$

$$\frac{1}{\beta_2(V_3 - V_{T2} - 1/2V_4)} = R_{DS1} + R_{DS2} \quad (24)$$

Substituting equations (22) and (23) into equation (24), and assuming $V_{T1} = V_{T2} = V_{T3}$, yields the following:

$$\frac{V_2}{I_{out}} = \quad (25)$$

$$\frac{1}{\beta_1[(2I_{ref}/\beta_3)^{1/2} - 1/4V_2]} + \frac{1}{\beta_2[(2I_{ref}/\beta_3)^{1/2} + 1/4V_2]} = R_{DS1} + R_{DS2}$$

Providing a common denominator in equation (25) yields the following:

$$\frac{V_2}{I_{out}} = \quad (26)$$

$$\frac{\beta_1[(2I_{ref}/\beta_3)^{1/2} - 1/4V_2] + \beta_2[(2I_{ref}/\beta_3)^{1/2} + 1/4V_2]}{\beta_1\beta_2[(2I_{ref}/\beta_3) - 1/16V_2^2]} =$$

$$R_{DS1} + R_{DS2}$$

Assuming $\beta_1 = \beta_2$, equation (26) yields the following:

$$\frac{V_2}{I_{out}} = \frac{2[(2I_{red}/\beta_3)]^{1/2}}{\beta_1[(2I_{ref}/\beta_3) - 1/16V_2^2]} = R_{DS1} + R_{DS2} \quad (27)$$

Equation (27) indicates that the combined resistance of $R_{DS1}$ and $R_{DS2}$ is immune to variations in voltages $V_{T1}$ and $V_{T2}$. Furthermore, the combined resistance of $R_{DS1}$ and $R_{DS2}$ is relatively immune to variations in voltage $V_2$ when voltage $V_2$ is small. Therefore, in circuit 600, it is preferred that voltage $V_2$ be no greater than 1 volt, and more preferred that voltage $V_2$ be no greater than half a volt. In this manner, the $\frac{1}{16} V_2^2$ term has little effect, and current signal $I_{out}$ is substantially linearly proportional to voltage signal $V_{in}$. Equation (27) also indicates that, for a constant $I_{ref}$, and sufficiently small voltage $V_2$, the combined resistance of $R_{DS1}$ and $R_{DS2}$ remains substantially constant. Assuming, for simplification purposes, that voltage $V_2$ is small (and continuing to assume that $R_{DS1} = R_{DS2}$ and $\beta_1 = \beta_2$), equation (27) can be substituted into equations (19) and (20) to yield the following:

$$\frac{V_2 - V_4}{I_{out}} = \frac{1}{\beta_1(2I_{ref}/\beta_3)^{1/2}} = R_{DS1} \quad (28)$$

$$\frac{V_4}{I_{out}} = \frac{1}{\beta_2(2I_{ref}/\beta_3)^{1/2}} = R_{DS2} \quad (29)$$

The combined resistance of $R_{DS1}$ and $R_{DS2}$ can be adjusted by adjusting the value of $I_{ref}$ generated by current source 610. The preferred value of $I_{ref}$ depends on various factors such as the desired linear range of $I_{min} \leq I_{out} \leq I_{max}$, the relative magnitudes of voltages $V_2$, $V_4$, $V_{T1}$ and $V_{T2}$, and the application in which circuit 600 is used. It is generally preferred that $I_{ref}$ be substantially less than $I_{min}$, for instance, $I_{ref} \leq \frac{1}{2} I_{min}$. Advantages of circuit 600 over circuit 500 include fewer components, add less power dissipation since the $\frac{1}{2}I_{out}$ current signal at signal path 516 need not be generated.

Figure 7:
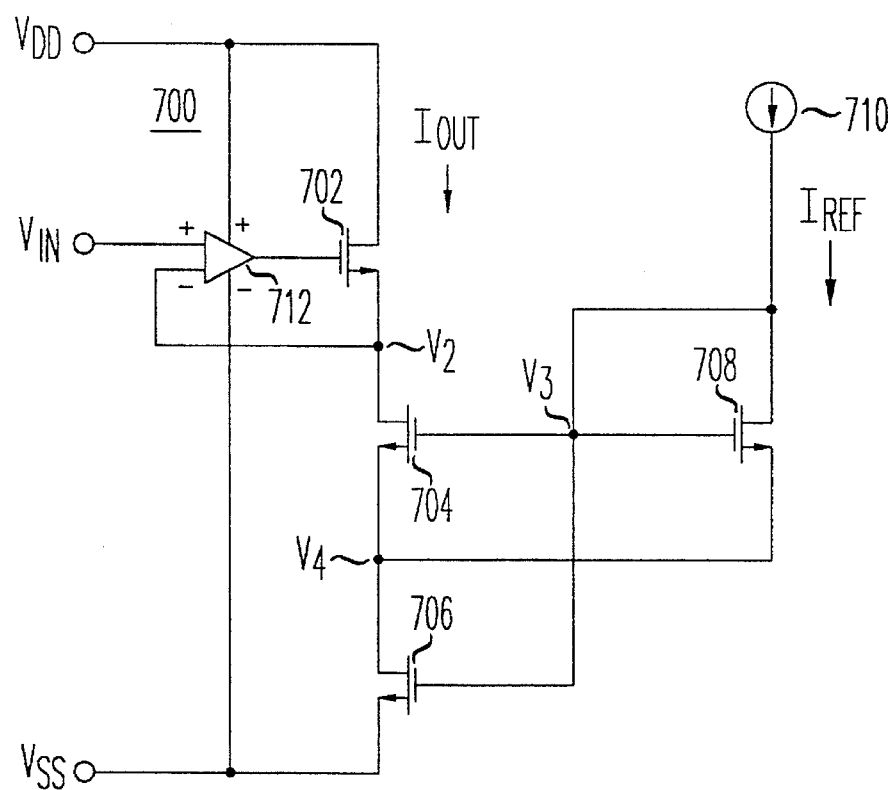
FIG. 7 is a circuit diagram illustrating a voltage-to-current converter in accordance with yet another embodiment of the invention.

FIG. 7 discloses a voltage-to-current converter in accordance with another embodiment of the invention. Circuit 700 is essentially identical to circuit 600, except that circuit 700 also includes operational amplifier 712. Voltage signal $V_{in}$ is applied to the noninverting input port of amplifier 712, the output port of amplifier 712 is coupled to the gate of transistor 702. In addition, the inverting input port of amplifier 712 is coupled to the source of transistor 702. Therefore, an amplified version of $V_{in}$ is applied to the gate of transistor 702. In this manner, a voltage signal $V_{in}$ less than the threshold voltage $V_{T1}$ of transistor 702 can be amplified to exceed $V_{T1}$ and subsequently converted into current signal $I_{out}$. As a result, circuit 700 provides linearized voltage-to-current conversion for a lower range of voltage signals than is provided by circuit 600, with the tradeoff being the increased hardware and power consumption attributed to amplifier 712.

Figure 8:
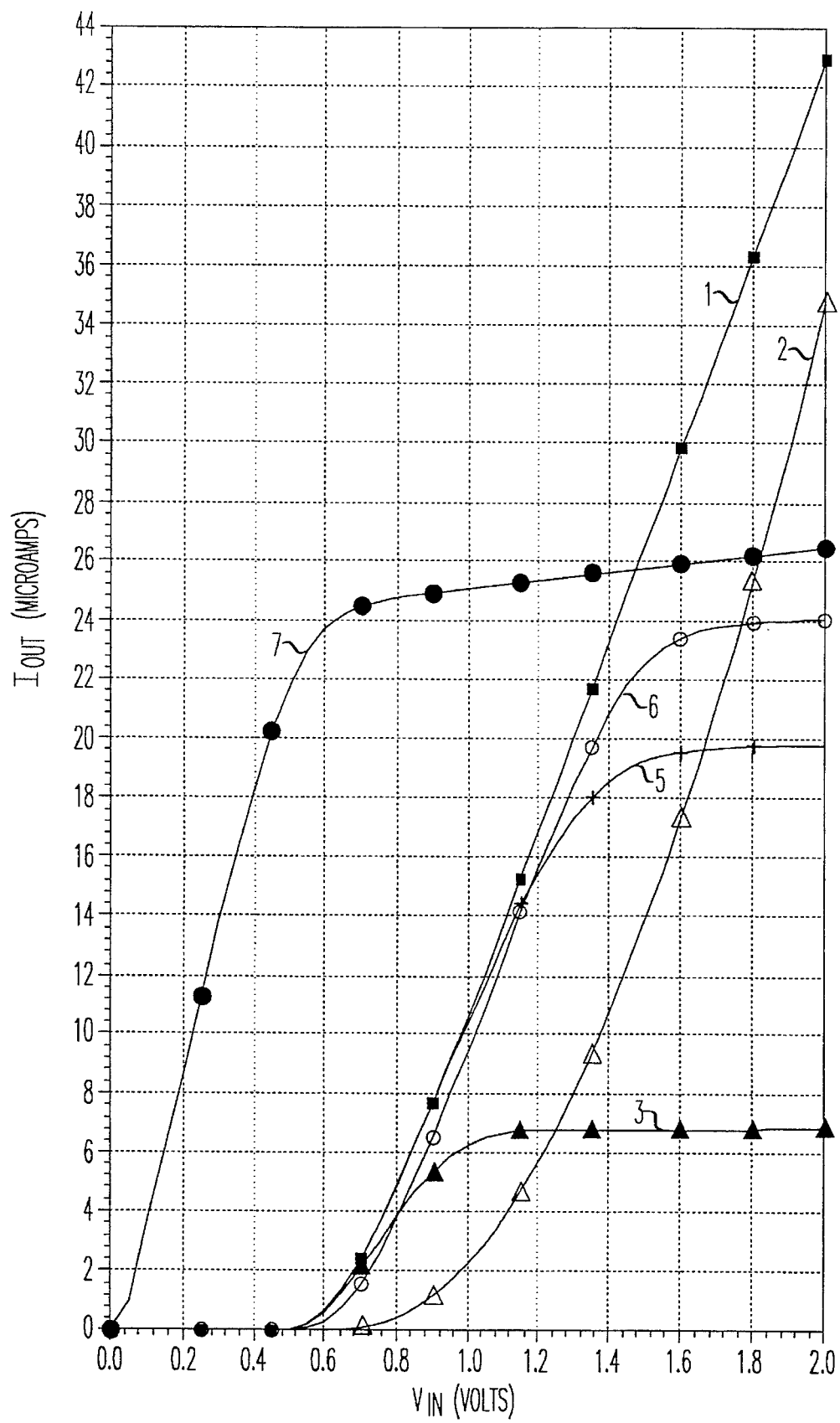
FIG. 8 is a graph illustrating a computer simulation of the current voltage characteristics for the voltage-to-current converters of FIGS. 1–3 and 5–7.

FIG. 8 is a graph illustrating a computer simulation of the current voltage characteristics for the voltage-to-current converters of FIGS. 1–3 and 5–7. The relationship between voltage signal $V_{in}$ and current signal $I_{out}$ is represented for circuit 100 by line 1, for circuit 200 by line 2, for circuit 300 by line 3, for circuit 500 by line 5, for circuit 600 by line 6, and for circuit 700 by line 7. It should be noted that, for voltage signals in the range of approximately 0.8 to 1.2 volts, line 2 for circuit 200 and line 3 for circuit 300 indicate non-linear conversion, whereas line 5 for circuit 500 and line 6 for circuit 600 indicate substantially linear conversion. Line 7 for circuit 700 is shifted left with respect to line 6, and indicates substantially linear conversion for voltage signals in the range of approximately 0.1 to 0.5 volts.

Figure 9:
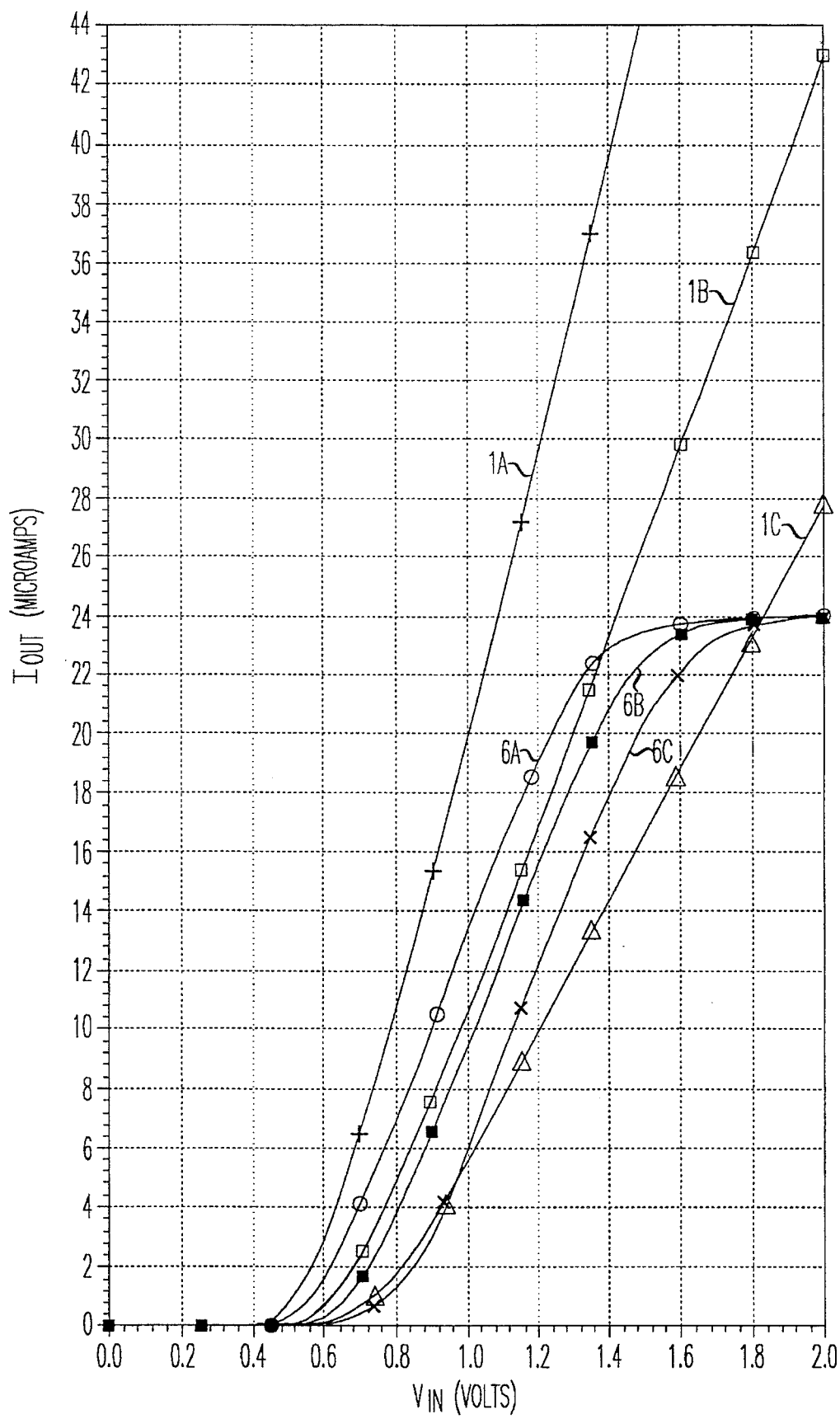
FIG. 9 is a graph illustrating a computer simulation of variations in the current-voltage characteristics for the voltage-to-current converters of FIGS. 1 and 6 as fabrication process parameters are varied.

FIG. 9 is a graph illustrating a computer simulation of variations in the current-voltage characteristics for the voltage-to-current converters of FIGS. 1 and 6 as fabrication process parameters are varied. This simulation illustrates the effects of varying the process parameters between a "fast corner" and a "slow corner". The "fast corner" is defined as one corner of the fabrication process resulting in relatively fast devices with high transconductances and low parasitic capacitances, whereas the "slow corner" is defined as the opposite corner of the fabrication process resulting in relatively slow devices with low transconductances and high parasitic capacitances. Circuit 100 is represented by lines 1A, 1B and 1C, with line 1A corresponding to the fast corner, line 1B corresponding to between the fast and slow corners, and line 1C corresponding to the slow corner. Likewise, circuit 600 is represented by lines 6A, 6B and 6C, with line 6A corresponding to the fast corner, line 6B corresponding to between the fast and slow corners, and line 6C corresponding to the slow corner. As is seen, the variation between lines 6A and 6C is significantly less than the variation between lines 1A and 1C. Therefore, the performance of circuit 600 is far less susceptible to process variations than the performance of circuit 100. Although circuit 100 displays substantially linear conversion, the wide variations in resistance are unacceptable in many applications.

It will be appreciated that FIGS. 8 and 9 are based on idealized circuit operation indicated by circuit simulation; however, relatively minor variations will not substantially affect the operation of circuits depicted. It will also be appreciated that equations (1)–(29) are based on various simplifications and assumptions for convenience of explanation, but that the represented circuits and signals perform substantially in accordance with the equations.

The voltage-to-current converter of the present invention may be used, for instance, in a phase-locked loop which includes a phase detector, a loop filter, a voltage-controlled oscillator, and a frequency divider. In particular, the voltage-controlled oscillator may include the voltage-to-current converter of the present invention for charging or discharging a capacitor in time constant circuitry of a current-controlled oscillator.

The transistor (e.g. transistor 402) which receives the voltage signal ($V_{in}$) can be readily implemented in FET, bipolar, and other technologies. The MOS reference resistor of the present invention can be readily implemented with various standard MOS technologies. In particular, a P-channel MOS (PMOS) reference resistor can be used. Furthermore, the MOS reference resistor need not necessarily transfer the entire current signal ($I_{out}$), although it must transfer at least a portion of the current signal. Likewise, the MOS reference resistor may transfer other currents in addition to the current signal. If desired, additional circuitry (such as a current mirror) may be added to provide a high impedance source current or a high impedance sink current based upon the current signal. A method of operating a voltage-to-current converter, as well as operating a MOS transistor with substantially constant drain-to-source resistance, is apparent from the foregoing.

Finally, it should be appreciated that although a MOS reference resistor has been illustrated herein, a bipolar reference resistor operating in a triode region of its respective I-V curve can be biased at the base, in accordance with the invention, to provide a substantially constant collector-to-emitter resistance.

It should, of course, be understood that while the present invention has been described in terms of several illustrative embodiments, other arrangements and methods of operation will be apparent to those of ordinary skill in the art. For example, while the embodiments of the invention have been described in reference to discrete functional elements, the function of one or more of these elements can be provided by one or more appropriately programmed general-purpose processors, or special-purpose integrated circuits, or digital signal processors, or an analog or hybrid counterpart of any of these devices. The invention is well suited for fabrication in a single integrated circuit or semiconductor chip. Finally, while the present invention has been described in reference to a particular system application, the inventive concept can be used in virtually any application where voltage-to-current conversion is desired. Therefore, the invention should be limited only by the spirit and scope of the appended claims.

The invention claimed is:

1. A voltage-to-current converter, comprising:
   a first transistor for receiving a voltage signal and transferring a current signal;
   a second MOS transistor for receiving a biasing voltage at a second gate and transferring at least a portion of the current signal between a second drain and a second source; and a biasing circuit for applying the biasing voltage to the second gate, the biasing voltage being a function of at least a voltage $V_{DS}$ between the second drain and the second source and a threshold voltage $V_T$ of the second transistor, such that the second transistor provides a substantially constant resistance between the second drain and the second source.

2. The converter of claim 1, in which the current signal is substantially linearly proportional to the voltage signal.

3. The converter of claim 1, in which the resistance is substantially $1/\beta V_C$, where $\beta$ is a gain for the second transistor, and $V_C$ is a constant voltage.

4. The converter of claim 3, in which the biasing voltage is linear function of $V_C$, $V_T$, and $V_{DS}$.

5. The converter of claim 4, in which the biasing voltage is substantially equal to $V_C+V_T+kV_{DS}$, where k is a constant in the range of approximately ⅓ to ⅔.

6. The converter of claim 5, in which k is approximately ½.

7. The converter of claim 1, in which second transistor is for transferring the current signal between the second drain and the second source.

8. The converter of claim 7, further comprising a third MOS transistor for receiving the biasing voltage at a third gate and transferring the current signal between a third drain and a third source, such that the third transistor provides a substantially constant resistance between the third drain and the third source.

9. The converter of claim 1, in which first transistor is an NMOS transistor for receiving the voltage signal at a first gate and transferring the current signal from a first drain to a first source, the second transistor is an NMOS transistor for transferring the current signal from the second drain to the second source, and the first source is coupled to the second drain.

10. The converter of claim 1, as part of an integrated circuit.

11. The converter of claim 1, as part of a phase-locked loop.

12. In an integrated circuit, a voltage-to-current converter comprising:

a first MOS transistor, including a first gate, a first drain, and a first source, for receiving a voltage signal at the first gate and transferring a current signal between the first drain and the first source;

a reference resistor, including a second MOS transistor, for providing a substantially constant reference resistance for the current signal, such that the current signal is substantially linearly proportional to the voltage signal;

the second MOS transistor including a second gate, a second drain, and a second source, for receiving a biasing voltage at the second gate and transferring the current signal between the second drain and the second source as the second transistor operates in a triode region; and a biasing circuit for applying the biasing voltage to the second gate, the biasing voltage being substantially equal to a sum of a constant voltage $V_C$, a threshold voltage $V_{T2}$ for the second transistor, and k times a voltage $V_{DS2}$ between the second drain and the second source, where k is a constant in the range of approximately ⅓ to ⅔, such that the second transistor provides a substantially constant second resistance of substantially $1/\beta_2 V_C$ between the second drain and the second source, where $\beta_2$ is a gain for the second transistor.

13. The integrated circuit of claim 12, in which the reference resistance is approximately equal to the second resistance.

14. The integrated circuit of claim 12, in which the second transistor is for operating substantially in accordance with $I_{DS2}=\beta_2=\beta_2[(V_{GS2}-V_{T2})V_{DS2}-kV_{DS2}^2]$, where $I_{DS2}$ is the current signal between the second drain and the second source, and $V_{GS2}$ is the biasing voltage between the second gate and the second source.

15. The integrated circuit of claim 12, in which the first transistor is an NMOS transistor, the second transistor is an NMOS transistor, and the first source is coupled to the second drain.

16. The integrated circuit of claim 12, in which the biasing circuit further includes a current mirror circuit for generating a second current signal substantially equal to k times the current signal, a current source for generating a reference current, a third MOS transistor, including a third gate, a third drain, and a third source, for receiving the biasing voltage at the third gate, and for transferring a combination of the second current signal and the reference current between the third drain and the third source, such that the third transistor has a substantially constant third resistance of substantially $1/\beta_3 V_C$ between the third drain and the third source, where $\beta_3$ is a gain for the third transistor, $V_{T3}$ is a threshold voltage for the third transistor, $\beta_3$ is approximately equal to $\beta_2$, and $V_{T3}$ is approximately equal to $V_{T2}$, and a fourth MOS transistor, including a fourth gate, a fourth drain, and a fourth source, for transferring the reference current to the third transistor, wherein the second, third and fourth gates are coupled together.

17. The integrated circuit of claim 12, in which the reference resistor further includes a third MOS transistor, the third MOS transistor including a third gate, a third drain, and a third source, with the third gate coupled to the second gate, and for transferring the current signal between the third drain and the third source, the biasing voltage being substantially equal to a sum of the constant voltage $V_C$, a threshold voltage $V_{T3}$ for the third transistor, and k times a voltage $V_{DS3}$ between the third drain and the third source, such that the third transistor provides a substantially constant third resistance of substantially $1/\beta_3 V_C$ between the third drain and the third source, where $\beta_3$ is a gain for the third transistor.

18. The integrated circuit of claim 17, in which the reference resistance is approximately equal to a sum of the second resistance and the third resistance.

19. The integrated circuit of claim 17, in which $\beta_3$ is approximately equal to $\beta_2$, $V_{T3}$ is approximately equal to $V_{T2}$, and the third resistance is approximately equal to the second resistance.

20. The integrated circuit of claim 17, in which the biasing circuit includes a current source for generating a reference current, and a fourth MOS transistor with a fourth gate, a fourth drain, and a fourth source, for transferring the reference current between the fourth drain and the fourth source, wherein the second, third and fourth gates are coupled together, and the third transistor transfers a combination of the current signal and the reference current between the third drain and the third source.

21. The integrated circuit of claim 17, further comprising an operational amplifier coupled to the first gate.

22. In an integrated circuit, a linearized voltage-to-current converter comprising:

a first NMOS transistor, including a first gate, a first source, and a first drain, for receiving a voltage signal at the first gate and transferring a current signal between the first drain and the first source;

a second NMOS transistor, including a second gate, a second source, and a second drain, for transferring the current signal as a current $I_{DS}$ between the second drain and the second source, thereby creating a voltage $V_{DS}$ between the second drain and the second source, where $\beta$ is a gain for the second transistor, $V_T$ is a threshold voltage for the second transistor, and $V_{GS}$ is a voltage between the second gate and the second source;

a signal path for transferring the current signal from the first source to the second drain; and a biasing circuit for dynamically applying $V_{GS}$ as $V_C+V_T+\frac{1}{2}V_{DS}$, where $V_C$ is a constant voltage, wherein the second transistor provides a substantially constant resistance $R_{DS}$ of substantially $1/\beta V_C$ between the second drain and the second source as the second transistor operates in a triode region substantially in accordance $I_{DS}=\beta[(V_{GS}-V_T)V_{DS}-\frac{1}{2}V_{DS}^2]$ so that a range of the current signal is substantially linearly proportional to a range of the voltage signal.

23. The integrated circuit of claim 22, in which the second transistor has a channel length of at least approximately 1 micrometer.

24. The integrated circuit of claim 22, in which the first transistor has a substantially constant resistance between the first drain and the first source that is substantially less than $1/\beta V_C$.

25. A method of converting a voltage signal into a current signal, comprising the steps of:

applying a voltage signal to a first transistor; and applying a biasing voltage to a gate of a second MOS transistor operating in a triode region such that the second transistor has a substantially constant drain-to-source resistance of substantially $1/\beta V_C$, where $\beta$ is a gain for the second transistor, and $V_C$ is a constant voltage, thereby providing a substantially constant resistance for a current signal flowing through the first and second transistors.

26. The method of claim 25, in which the biasing voltage is substantially equal to $V_C+V_T+kV_{DS}$, where $V_T$ is a threshold voltage of the second transistor, $V_{DS}$ is a drain-to-source voltage of the second transistor, and k is a constant in the range of approximately ⅓ to ⅔.

27. The method of claim 26, in which the second transistor operates substantially in accordance with $I_{DS}=\beta[(V_{GS}-V_T)V_{DS}-kV_{DS}^2]$, where $I_{DS}$ is a drain-to-source current for the second transistor and is the current signal, and $V_{GS}$ is a gate-to-source voltage for the second transistor and is the biasing voltage.

28. A method of operating a transistor in a triode region, comprising the steps of:

applying a biasing voltage to a first terminal of the transistor, the biasing voltage being a function of at least a threshold voltage of the transistor and a voltage across second and third terminals of the transistor, such that the transistor has a substantially constant resistance between the second and third terminals.

29. A method of operating a MOS transistor in a triode region so that the MOS transistor provides a substantially constant drain-to-source resistance, comprising the steps of:

applying a current signal between a drain and a source of the transistor; and applying a biasing voltage to a gate of the transistor, the biasing voltage being a function of a constant voltage $V_C$, a threshold voltage $V_T$ for the transistor, and a drain-to-source voltage $V_{DS}$ of the transistor, such that the transistor has a substantially constant drain-to-source resistance of substantially $1\beta V_C$, where $\beta$ is a gain for the transistor.

30. The method of claim 29, in which the biasing voltage between the gate and the source is approximately $V_C+V_T+kV_{DS}$, where k is a constant in the range of approximately ⅓ to ⅔.

* * * * *